(12) United States Patent
Engelhardt et al.

(10) Patent No.: US 10,736,236 B2
(45) Date of Patent: Aug. 4, 2020

(54) POWER ELECTRONIC CONVERSION SYSTEM

(71) Applicant: GE Aviation Systems, LLC, Grand Rapids, MI (US)

(72) Inventors: Michel Engelhardt, Woodbury, NY (US); Evgeny Dobin, Bohemia, NY (US)

(73) Assignee: GE Aviation Systems, LLC, Grand Rapids, MI (US)

( * ) Notice: Subject to any disclaimer, the term of this patent is extended or adjusted under 35 U.S.C. 154(b) by 0 days.

(21) Appl. No.: 15/872,002

(22) Filed: Jan. 16, 2018

(65) Prior Publication Data

US 2019/0223319 A1    Jul. 18, 2019

(51) Int. Cl.
*H05K 7/20*    (2006.01)
*F28F 3/02*    (2006.01)
*F28D 15/02*   (2006.01)

(52) U.S. Cl.
CPC .......... *H05K 7/2039* (2013.01); *F28D 15/02* (2013.01); *F28F 3/02* (2013.01); *H05K 7/20327* (2013.01); *H05K 7/20336* (2013.01); *H05K 7/20436* (2013.01); *H05K 7/20927* (2013.01); *H05K 7/20936* (2013.01)

(58) Field of Classification Search
CPC .......... H05K 7/20218; H05K 7/20254; H05K 7/2039; H05K 7/205; H05K 7/20509; H05K 7/20336; H05K 7/20936; H05K 7/20318; H05K 7/20445; H05K 7/2049; H05K 7/20309; H05K 7/20327; H05K 7/20545; H05K 13/046; H05K 1/0201; H05K 1/0203; H05K 1/0209; H05K 2201/064; H05K 7/20409; H01L 23/473; H01L 2924/0002; H01L 2924/00; H01L 23/427; H01L 2224/13101; H01L 23/4093; H01L 21/4871; H01L 23/467; H01L 23/36; H01L 23/46; F28D 15/02; F28D 15/0233; G06F 1/206; G06F 1/20; F28F 3/02
USPC ........ 361/699, 702, 704, 711, 715–716, 719, 361/690, 700, 709, 726, 679.54, 698, 707; 165/80.4, 104.33, 80.3; 257/714, 257/E23.098, 706, E23.097, E23.088, 718
See application file for complete search history.

(56) References Cited

U.S. PATENT DOCUMENTS 4,117,499 A * 9/1978 Strauss ............... G03B 17/20
                                              396/229
4,177,499 A * 12/1979 Volkmann ........... H05K 7/209
                                              361/690

(Continued)

FOREIGN PATENT DOCUMENTS

DE     102011007315 A1 * 10/2012 ........... H01G 2/08

*Primary Examiner* — Mandeep S Buttar
*Assistant Examiner* — Robert D Brown
(74) *Attorney, Agent, or Firm* — Wood IP LLC

(57) ABSTRACT

A power electronic conversion system includes a first electronic component that generates heat; a mounting plate comprising a horizontal plate and a first vertical riser with vertical configuration, wherein the first vertical riser is configured to mount the first electronic component; a first thermal pad disposed between the first electronic component and the first vertical riser to reduce a contact resistance; and a cold plate coupled to the mounting plate and comprised at least one cooling medium passage defined by a plurality of internal fins.

20 Claims, 6 Drawing Sheets

(56) References Cited

U.S. PATENT DOCUMENTS

| | | | | |
|---|---|---|---|---|
| 4,785,379 A * | 11/1988 | Goodrich | H05K 7/1404 | 165/185 |
| 5,316,075 A * | 5/1994 | Quon | F28F 13/02 | 165/104.33 |
| 5,966,289 A * | 10/1999 | Hastings | G06F 1/184 | 165/185 |
| 5,966,291 A * | 10/1999 | Baumel | H05K 7/20927 | 165/80.3 |
| 6,166,937 A * | 12/2000 | Yamamura | H01L 23/473 | 257/E23.098 |
| 6,377,453 B1 * | 4/2002 | Belady | H05K 7/20345 | 165/185 |
| 6,411,512 B1 * | 6/2002 | Mankaruse | H05K 7/20336 | 165/104.33 |
| 8,344,842 B1 * | 1/2013 | Luzanov | H05K 1/141 | 336/192 |
| 9,113,579 B2 * | 8/2015 | Cottet | F28D 15/0266 | |
| 2006/0120039 A1 * | 6/2006 | Yuval | H01L 23/467 | 361/694 |
| 2006/0126297 A1 * | 6/2006 | Belady | G06F 1/189 | 361/700 |
| 2007/0125524 A1 * | 6/2007 | Zoodsma | H01L 23/467 | 165/104.33 |
| 2007/0133179 A1 * | 6/2007 | Han | G06F 1/20 | 361/719 |
| 2007/0253201 A1 * | 11/2007 | Blincoe | F21V 23/02 | 362/294 |
| 2008/0084667 A1 * | 4/2008 | Campbell | H05K 7/20009 | 361/702 |
| 2009/0086427 A1 * | 4/2009 | Okumura | H01L 25/18 | 361/690 |
| 2009/0108435 A1 * | 4/2009 | Bernstein | H01L 23/473 | 257/691 |
| 2010/0002399 A1 * | 1/2010 | Mori | H01L 23/3735 | 361/719 |
| 2010/0254089 A1 * | 10/2010 | Anderl | H01L 23/4093 | 361/702 |
| 2012/0206880 A1 * | 8/2012 | Andres | H01L 23/4275 | 361/700 |
| 2012/0287582 A1 * | 11/2012 | Vinciarelli | H01R 43/24 | 361/728 |
| 2013/0020694 A1 * | 1/2013 | Liang | H01L 25/072 | 257/691 |
| 2013/0104592 A1 * | 5/2013 | Cottet | H05K 7/20672 | 62/419 |
| 2013/0214406 A1 * | 8/2013 | Schultz | H01L 23/46 | 257/713 |
| 2015/0037648 A1 * | 2/2015 | Nguyen | H01M 10/625 | 429/120 |
| 2015/0055302 A1 * | 2/2015 | Nagatomo | H01L 23/3735 | 361/709 |
| 2015/0354775 A1 * | 12/2015 | Kurpick | F21S 41/147 | 362/516 |
| 2016/0291652 A1 * | 10/2016 | Rossi | H05K 7/20772 | |
| 2017/0188488 A1 * | 6/2017 | Takezawa | H02M 7/48 | |
| 2017/0290198 A1 * | 10/2017 | Shepard | H01L 23/44 | |
| 2017/0311478 A1 * | 10/2017 | Engelhardt | H01L 23/4275 | |
| 2018/0224733 A1 | 8/2018 | McMillan | | |
| 2018/0242442 A1 * | 8/2018 | Luskind | G06F 1/203 | |
| 2019/0035709 A1 * | 1/2019 | Lesartre | H01L 23/3672 | |
| 2019/0043785 A1 * | 2/2019 | Wang | H01L 23/473 | |

* cited by examiner

POWER ELECTRONIC CONVERSION SYSTEM

BACKGROUND

Embodiments of the disclosure relate generally to a power electronic conversion system, and more particularly relate to electronic components cooling in the power electronic conversion system.

Electronic components of a power electronic conversion system used in onboard aircrafts, sea platforms or other vehicles that operate in extreme temperatures are typically protected from overheating by cooling devices. In current approaches, the electronic components are mounted adjacent a cooling plate, and the cold plate is configured to remove the heat from the electronic components via a cooling medium within in the cold plate.

However, the cooling plate usually has a rough surface leading to high thermal conduction resistance between the cooling plate and the electronic components, and usually requires an expensive flatness finishing. Additionally, some complex ways for mounting the electronic components on the cold plate, for example, by punching holes on the cold plate, may interfere flow patterns of the cooling medium. Moreover, complex manufacturing processes of the cooling plate and/or assembling processes of the cooling plate and the electronic components may lead to a relatively long delivery time.

Therefore, it is desirable to provide a power electronic conversion system to address at least one or more of the above-mentioned situations.

BRIEF DESCRIPTION

In accordance with one embodiment disclosed herein, a power electronic conversion system includes a first electronic component that generates heat, a mounting plate, a first thermal pad and a cold plate. The mounting plate includes a horizontal plate and a first vertical riser perpendicular to the horizontal plate, wherein the first vertical riser is configured to support the first electronic component. The first thermal pad is disposed between the first electronic component and the first vertical riser to reduce a contact resistance. The cold plate coupled to the mounting plate and comprising at least one cooling medium passage defined by a plurality of internal fins.

BRIEF DESCRIPTION OF THE DRAWINGS

The accompanying drawings, which are incorporated herein and form part of the specification, illustrate the present disclosure and, together with the description, further serves to explain the principles of the disclosure and to enable a person skilled in the relevant art(s) to make and use the disclosure.

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a", and "an" do not denote a limitation of quantity, but rather denote the presence of at least one of the referenced items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. The terms "component", "module", "system", "interface", or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer.

Figure 1:
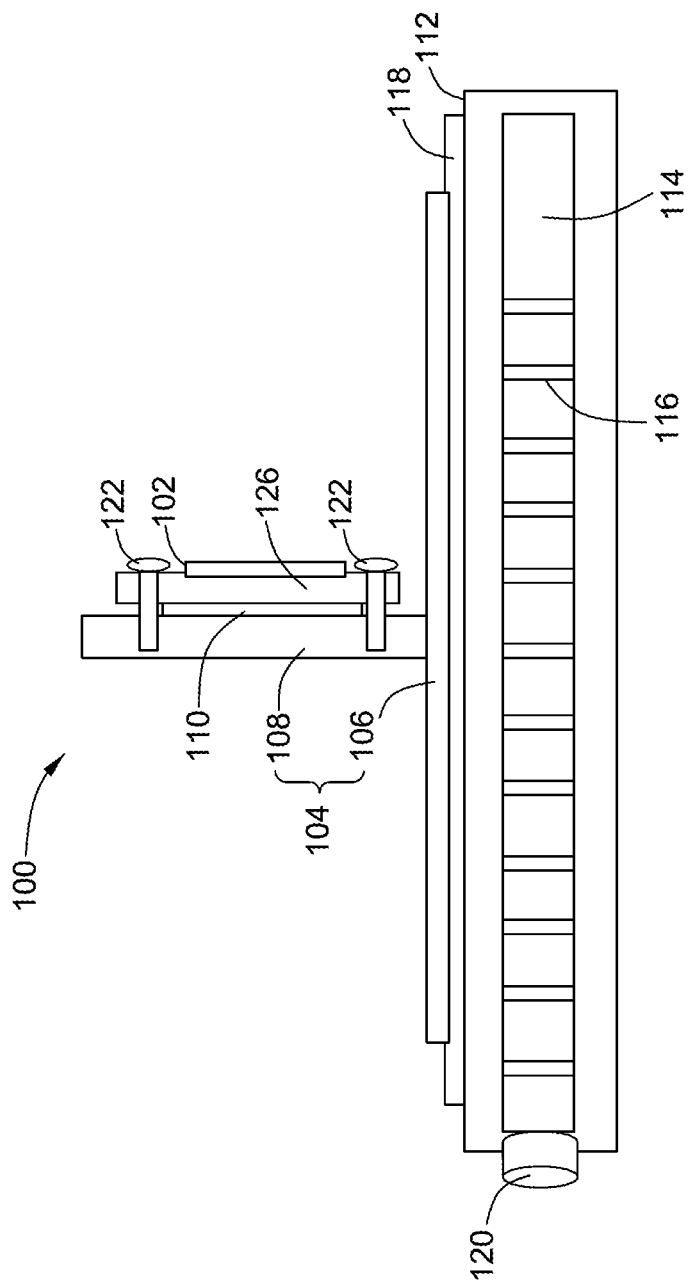
FIG. 1 is a cross-sectional view of a power electronic conversion system in accordance with aspects described herein.

FIG. 1 is a cross-sectional view of a power electronic conversion system 100. The power electronic conversion system 100 includes a cold plate 112, a mounting plate 104 mounted on the cold plate 112, a first electronic component 102 mounted on the mounting plate 104, and a first thermal pad 110. The first electronic component 102 generates heat which can be dissipated through the cold plate 112. The mounting plate 104 includes a horizontal plate 106 and a first vertical riser 108 substantially perpendicular to the horizontal plate 106, and the first vertical riser 108 is configured to support the first electronic component 102 mounted thereon. In some embodiments, there is a plurality of electronic components mounted on the first vertical riser 108. The horizontal plate 106 of the mounting plate 104 is coupled to the cold plate 112 which comprises at least one cooling medium passage 114 defined by a plurality of internal fins 116. The first thermal pad 110 is disposed between the first electronic component 102 and the first vertical riser 108 to reduce a contact thermal resistance.

In some embodiments, the horizontal plate 106 and the first vertical riser 108 are integrally formed to provide a better heat transfer from the first electronic component 102 to the cold plate 112. In other embodiments, the horizontal plate 106 and the first vertical riser 108 can also be assembled together via brazing, bonding or mechanical connecting. In some embodiments, the mounting plate 104 which is in thermal contact with the first electronic component 102 may include a heat pipe plate, a graphite plate or any other thermal spreader capable of laterally spreading heat with a small temperature gradient (i.e. between 1 and 10 □) across its entirety.

In some embodiments, the heat generated by the electronic component 102 is transferred from the mounting plate 104 to the cold plate 112. The cold plate 112 includes an inlet port 120 that receive a cooling medium. The cooling medium may be flowed through the cooling medium passages 114 to absorb heat and discharged from an outlet port (not shown) associated with the cold plate 112. The cooling medium may include air, liquid, or gas as is required for a special application.

In some embodiments, as shown in FIG. 1, a printed circuit board (PCB) 126 is coupled between the first electronic component 102 and the first thermal pad 110. The first electronic component 102 is mounted on the PCB 126, and the PCB 126 is secured on the first vertical riser 108 via two fasteners 122. The fastener 122 is selected from the group consisting of a screw, a bolt, a clip and a combination thereof. The number of the fasteners 122 is not limited herein, and in some embodiment, the number may be greater than 2, such as 3, 4, 5 etc. Herein, the PCB 126 mounted with the first electronic component 102 is mounted on the first vertical riser 108 via the fasteners 122, and there is no need to punch mounting holes in the cold plate 112, which improves the heat transfer performance of the internal cooling medium flow and reduces cooling medium flow pressure drop due to mounting.

In some embodiments, to maximize thermal conductivity between the first electronic component 102 and the first vertical riser 108, the first electronic component 102, the PCB 126, the first thermal pad 110 and the first vertical riser 108 are in thermal contact substantially over the entire length of either component.

As shown in FIG. 1, the horizontal plate 106 is attached to the cold plate 112 via a medium layer 118. In some embodiments, the medium layer 118 is a second thermal pad, which can facilitate disassembly and decoupling the mounting plate 104 from the cold plate 112 when the mounting plate 104 is needed to be modified, for example, when it is needed to debug the first electronic component 102 on the mounting plate 104 during prototype tests. In some embodiments, the medium layer 118 is a bonding layer formed from bonding materials with high thermal conductivity.

In some embodiments, the first and second thermal pads 110, 118 are relatively firm at a room temperature and may become softer and well able to fill gaps at higher temperatures. So, the first thermal pad 110 between the PCB 126 and the first vertical riser 108, the second thermal pad 118 between the cold plate 112 and the horizontal plate 106 can be used to fill air gaps caused by imperfect flat surfaces to improve the heat transfer and save a cost of flatness finishing.

Alternatively, in some embodiments, the mounting plate 104 and the cold plate 112 are integrally formed to eliminate interface materials and eliminate assembly time. The integrated mounting plate 104 and cold plate 112 can enhance the heat transfer from the first electronic component 102 to the cooling medium. In some embodiments, the mounting plate 104 and the cold plate 112 are integrally formed by additive manufacturing. Besides the above-mentioned benefits, the additive manufacturing can also provide a simpler design, a faster manufacturing process, a more precise Geometric, Dimensioning and Tolerancing (GD&T) interface characteristic and a lower cost. In some embodiments, the horizontal plate 106 and the cold plate 112 are integrally formed by additive manufacturing, and the first vertical riser 108 is mounted on the horizontal plate 106 via brazing, bonding or mechanical connecting.

Figure 2:
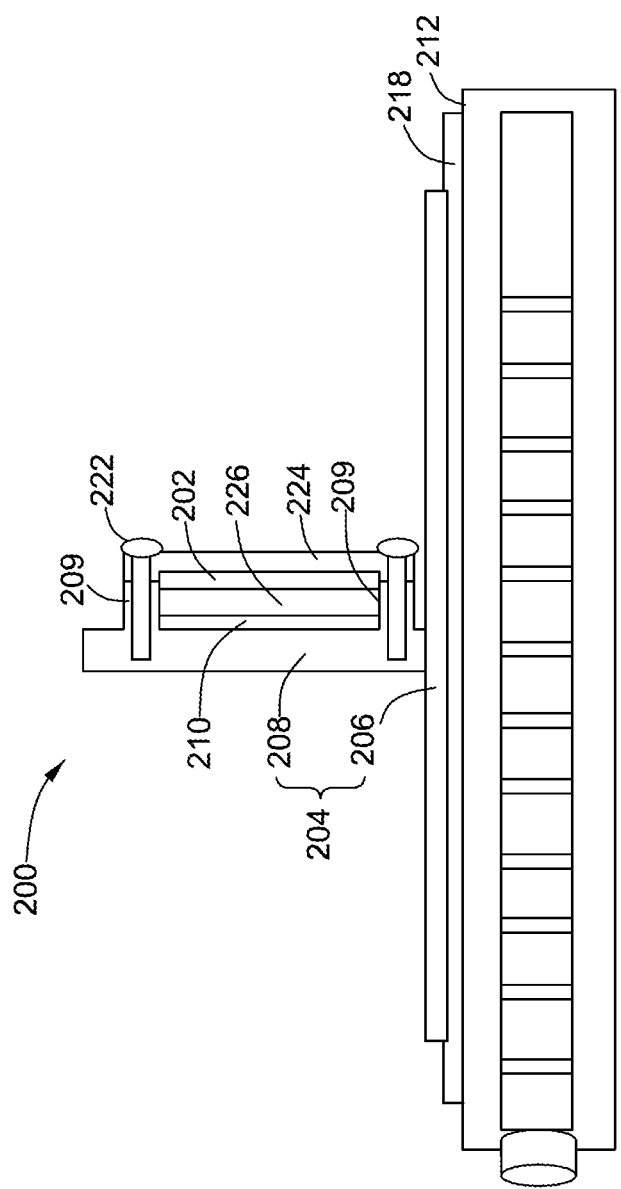
FIG. 2 is a cross-sectional view of a power electronic conversion system in accordance with aspects described herein.

FIG. 2 is a cross-sectional view of a power electronic conversion system 200. The power electronic conversion system 200 includes a cold plate 212, a mounting plate 204 mounted on the cold plate 212, a first electronic component 202 mounted on the mounting plate 204, a first thermal pad 210 and a PCB 226. The mounting plate 204 includes a horizontal plate 206 and a first vertical riser 208 substantially perpendicular to the horizontal plate 206, and the first vertical riser 208 is configured to support the first electronic component 202 mounted thereon. The first vertical riser 208 includes at least two supporting elements 209 for positioning the first electronic component 202, the PCB 226 and the first thermal pad 210. A mounting apparatus 224 is in thermal contact with the first electronic component 202 and configured to secure the first electronic component 202 to the first vertical riser 208 via two fasteners 222. The fasteners 222 are inserted through the mounting apparatus 224 and the supporting elements 209, and there is no need to punch mounting holes in the PCB 226 and the first thermal pad 210. In some embodiments, the mounting apparatus 224 may include a heat sink to enhance the heat transfer. In some embodiments, the mounting apparatus 224 may include a shock and vibration isolator based on the requirement. This design of combining the heat sink and/or the shock and vibration isolator within the mounting apparatus 224 can provide a small packaging size with good heat transfer performance and high structural integrity.

Figure 3:
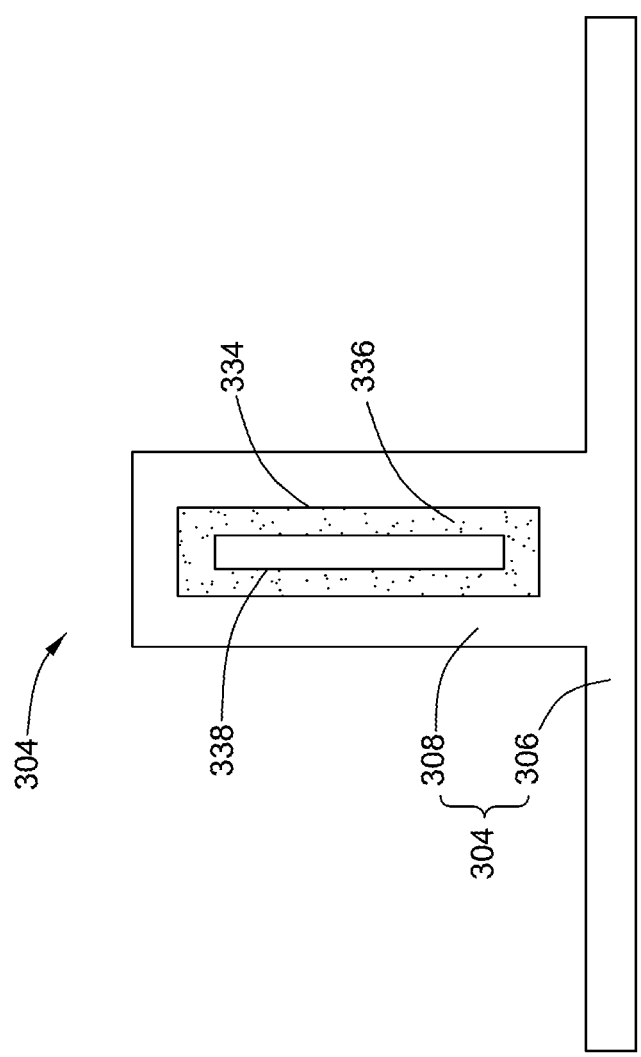
FIG. 3 is a cross-sectional view of another mounting plate can be used in the power electronic conversion system of FIG. 1 in accordance with aspects described herein.

FIG. 3 is a cross-sectional view of a mounting plate 304 that may be used to replace the mounting plate 104 of the power electronic conversion system 100 of FIG. 1. In some embodiments, as shown in FIG. 3, the mounting plate 304 comprises a phase change material 336, which is filled in an internal space 334 of the mounting plate 304. The internal space 334 may be defined in a first vertical riser 308, in a horizontal plate 306 or over the whole mounting plate 304. In some embodiments, there may be a plurality of internal spaces filled with the phase change material 336 discretely distributed in the mounting plate 304. The phase change material 336 can melt and solidify at a transition temperature, and large amounts of energy (in the form of heat) can be stored in the phase change material 336 at the transition temperature. Referring to FIG. 1, the phase change material 336 may be a low temperature solder, salt, or paraffin/wax, and is selected to have a transition temperature between a steady state temperature of the cold plate 112 and a critical temperature of the first electronic component 102. Therefore, the cold plate 112 and the system 100 will not approach the critical temperature nor damage by a transient pulse of the first electronic component 102, such as in some pulsed laser applications.

Figure 4:
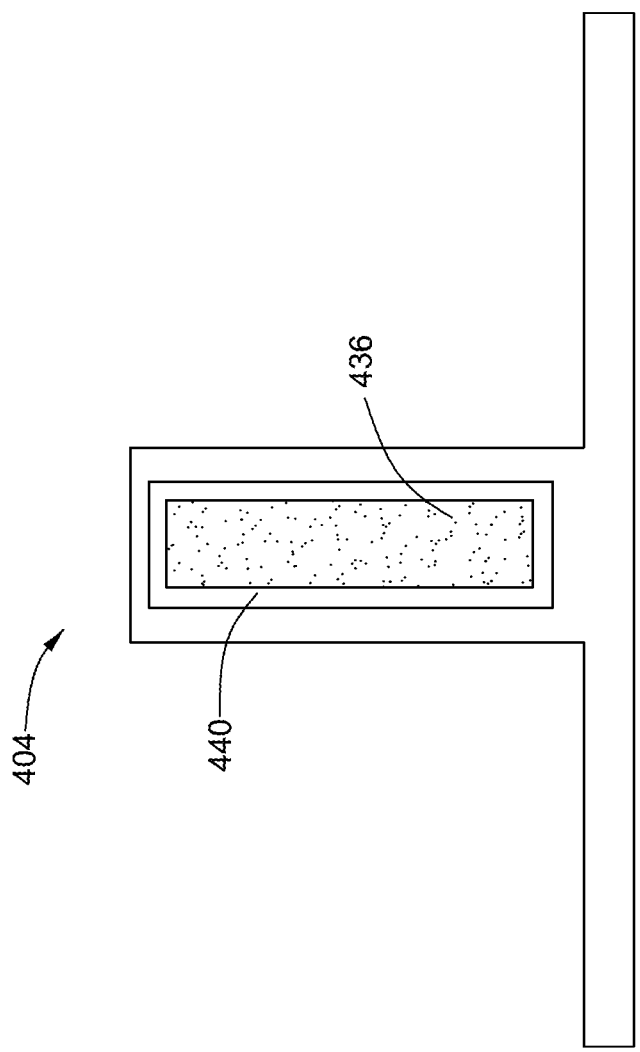
FIG. 4 is a cross-sectional view yet another a mounting plate can be used in the power electronic conversion system of FIG. 1 in accordance with aspects described herein.

The phase change material 336 may undergo a rapid thermal expansion during large transient pulsed heat dissipation, and thereby, excessive internal pressure forces may be produced in the mounting plate 304, and the mounting plate 304 may deform or even break which will cause leakage of the phase change material 336. In some embodiment, as shown in FIG. 3, the mounting plate 304 further includes an internal compressible thermal pad 338 integrated into the phase change material 336 to mitigate the internal pressure forces occurred by the phase change material 336. In some embodiment, as shown in FIG. 4, a mounting plate 404 used to replace the mounting plate 104 of the power electronic conversion system 100 of FIG. 1. further includes an internal compressible thermal pad 440 defined as a cover of a phase change material 436 to be positioned outward of the phase change material 436.

Figure 5:
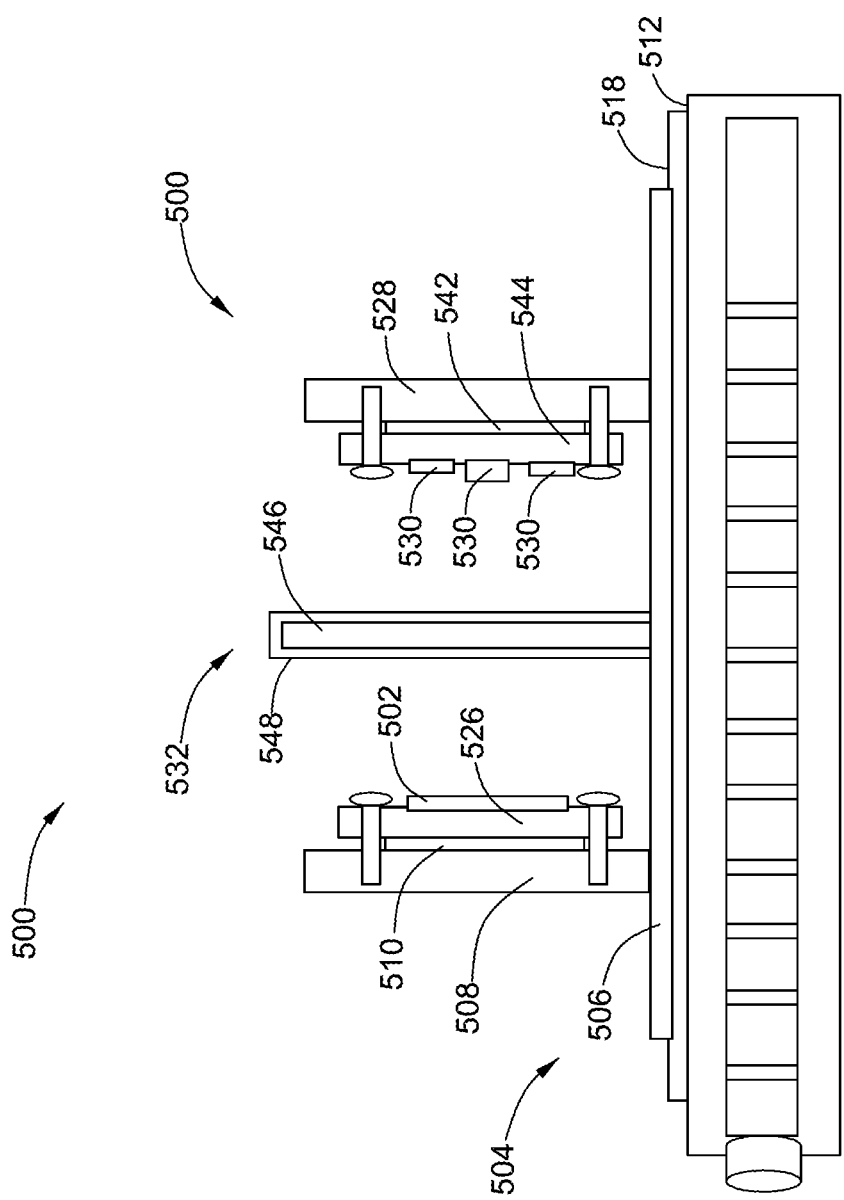
FIG. 5 is a cross-sectional view of a power electronic conversion system in accordance with aspects described herein.

FIG. 5 is a cross-sectional view of a power electronic conversion system 500. The power electronic conversion system 500 includes a first electronic component 502, a mounting plate 504, a PCB 526, a first thermal pad 510, a medium layer 518, a cold plate 512 and a radiation heat shield 532. The mounting plate 504 includes a horizontal plate 506, a first vertical riser 508 and a second vertical riser 528 substantially perpendicular to the horizontal plate 506. The first electronic component 502, the PCB 526, the first thermal pad 510, the medium layer 518, the cold plate 512, the horizontal plate 506 and the first vertical riser 508 have similar structures and functions as the embodiment in FIG. 1, and thus will not be described again herein. In some other embodiments, the structures and functions of the first electronic component 502, the PCB 526, the first thermal pad 510 and the first vertical riser 508 are similar as the embodiment in FIG. 2.

As shown in FIG. 5, the power electronic conversion system 500 further includes at least one second electronic component 530, a PCB 544 and a third thermal pad 542. In this embodiment, there are three second electronic components 530. The second vertical riser 528 is configured to support the second electronic components 530. The third thermal pad 542 is disposed between the second electronic components 530 and the second vertical riser 528 to reduce a contact thermal resistance. The PCB 544 is coupled between the second electronic components 530 and the third thermal pad 542.

Referring to FIG. 5, the radiation heat shield 532 is attached to and substantially perpendicular to the horizontal plate 506, and the radiation heat shield 532 is positioned between the first and second vertical risers 508, 528 to absorb radiation from the first and second electronic components 502, 530 and drive the radiative heat into the cold plate 512 via the horizontal plate 506. In this embodiment, both the first and the second electronic components 502, 530 are facing the radiation heat shield 532. In this embodiment, the radiation heat shield 532 includes a vertical solid plate 546 with a selective heat transfer coating 548 for efficiently absorbing radiation from the first and second electronic components 502, 530. In some other embodiments, the radiation heat shield 532 may include an integrated heat pipe (not shown) or a graphite or graphene conductive element (not shown) to transfer the absorbed radiative heat into the cold plate 512 via the horizontal plate 506.

Figure 6:
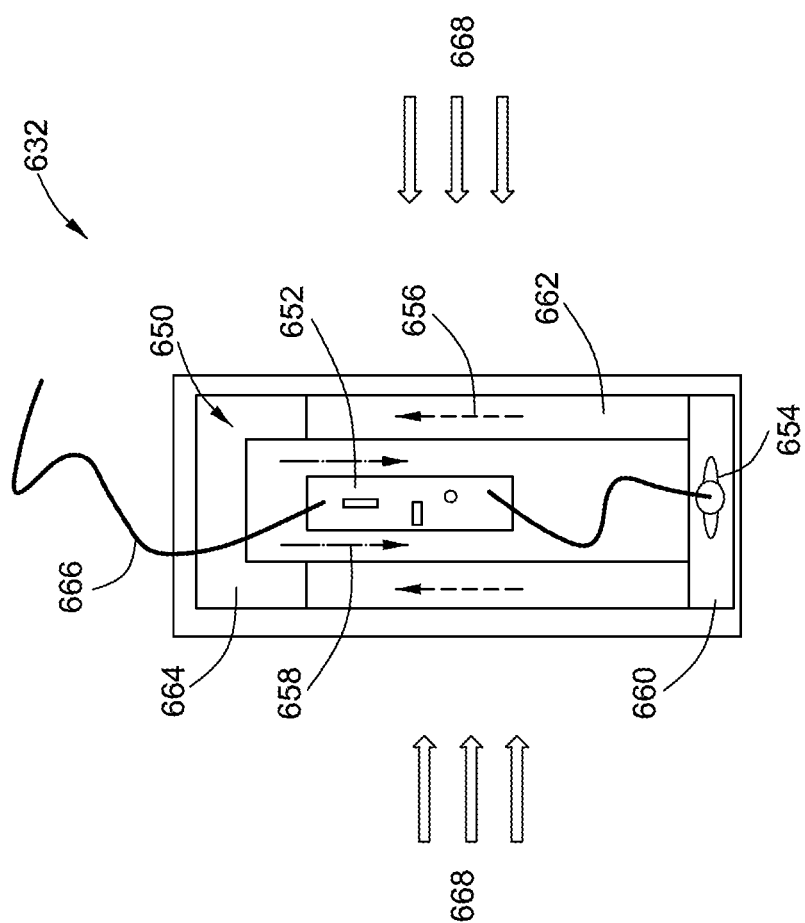
FIG. 6 is a cross-sectional view of another radiation heat shield can be used in the power electronic conversion system of FIG. 5 in accordance with aspects described herein.

In some embodiments, referring to FIG. 5, at least one of the radiation heat shield 532, the first vertical risers 508 and the second vertical risers 528 may include an internal circulation fluid heat pipe to dissipate heat from the first and second electronic components 502, 530. As shown in FIG. 6, the radiation heat shield 632 may be used to replace the radiation heat shield 532 of the power electronic conversion system 500, the radiation heat shield 632 includes an internal circulation fluid heat pipe 650. Radiated heat 668 from the electronic components is absorbed by a liquid in a liquid section 660 of the internal circulation fluid heat pipe 650, and the liquid is gradually vaporized along a first fluid flow direction 656 through a liquid/vapor section 662 to a vapor section 664. Then heat is released from an upper part of the radiation heat shield 632 to environment, and the vapor condenses to the liquid phase and returns to the liquid section 660 along a second fluid flow direction 658 by gravity or capillarity action. The internal circulation fluid heat pipe 650 includes a controller 652 and a piezo agitator 654. The controller 652 is electrically connected with an external power supplier (not shown) via electrical input wires 666, and the piezo agitator 654 is controlled and powered by the controller 652. In some embodiments, the internal circulation fluid heat pipe 650 includes a miniature pump to enhance the fluid circulation in the heat pipe 650, and the miniature pump is also controlled and powered by the controller 652.

While embodiments of the disclosure have been described herein, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

Furthermore, the skilled artisan will recognize the interchangeability of various features from different embodiments. The various features described, as well as other known equivalents for each feature, can be mixed and matched by one of ordinary skill in this art to construct additional systems and techniques in accordance with principles of this disclosure.

The invention claimed is:

1. A power electronic conversion system, comprising:
a first electronic component being mounted on a printed circuit board and generating heat;
a mounting plate comprising (i) a phase change material (ii); a horizontal plate; and (iii) a first vertical riser perpendicular to the horizontal plate, the first vertical riser being configured to support the first electronic component and the printed circuit board fastened thereto;
a first thermal pad disposed between the first electronic component and the first vertical riser to reduce a contact resistance; and
a cold plate attached along the length of the horizontal plate of the mounting plate and comprising at least one cooling medium passage defined by a plurality of internal fins being disposed within the cold plate.

2. The electronic conversion system of claim 1, wherein the printed circuit board is coupled between the first electronic component and the first thermal pad.

3. The electronic conversion system of claim 1, wherein the mounting plate further comprises a second vertical riser perpendicular to the horizontal plate, and the second vertical riser is configured to support a second electronic component.

4. The electronic conversion system of claim 3, further comprising a radiation heat shield between the first and second vertical risers to absorb radiation from the first and second electronic components, wherein the radiation heat shield is attached to the horizontal plate of the mounting plate.

5. The electronic conversion system of claim 4, wherein the radiation heat shield comprises a vertical solid plate with a selective heat transfer coating to absorb radiation from the first and second electronic components.

6. The electronic conversion system of claim 4, wherein the radiation heat shield comprises an integrated heat pipe or a graphite or graphene conductive element to transfer the absorbed radiative heat into the cold plate via the horizontal plate.

7. The electronic conversion system of claim 4, wherein at least one of the radiation heat shield, the first vertical riser and the second vertical riser comprises an internal circulation fluid heat pipe to dissipate heat from the first and second electronic components.

8. The electronic conversion system of claim 7, wherein the internal circulation fluid heat pipe comprises at least one of a miniature pump and a piezo agitator.

9. The electronic conversion system of claim 8, wherein the internal circulation fluid heat pipe further comprises a controller configured to control and power the miniature pump and/or the piezo agitator.

10. The electronic conversion system of claim 1, wherein the horizontal plate is attached to the cold plate via a second thermal pad.

11. The electronic conversion system of claim 1, wherein the horizontal plate is attached to the cold plate via a bonding layer.

12. The electronic conversion system of claim 1, wherein the horizontal plate and the cold plate are integrally formed by additive manufacturing.

13. The electronic conversion system of claim 1, wherein the mounting plate and the cold plate are integrally formed by additive manufacturing.

14. The electronic conversion system of claim 1, further comprising an inlet port and an outlet port associated with the cold plate.

15. The electronic conversion system of claim 1, wherein the mounting plate further comprises an internal compressible thermal pad integrated into the phase change material.

16. The electronic conversion system of claim 15, wherein the mounting plate comprises an internal compressible thermal pad positioned outward of the phase change material.

17. The electronic conversion system of claim 1, further comprising a fastener configured to secure the first electronic component on the first vertical riser, wherein the fastener is selected from the group consisting of a screw, a bolt, a clip and a combination thereof.

18. The electronic conversion system of claim 1, further comprising a mounting apparatus configured to secure the first electronic component to the first vertical riser.

19. The electronic conversion system of claim 15, wherein the mounting apparatus comprises a heat sink and/or a shock and vibration isolator.

20. The electronic conversion system of claim 1, wherein the phase change material is filled in an internal space of the mounting plate.

* * * * *